United States Patent
Bae et al.

(10) Patent No.: US 7,060,563 B2
(45) Date of Patent: Jun. 13, 2006

(54) LOCAL SONOS-TYPE STRUCTURE HAVING TWO-PIECE GATE AND SELF-ALIGNED ONO AND METHOD FOR MANUFACTURING THE SAME

(75) Inventors: Geum-Jong Bae, Suwon (KR); Nae-In Lee, Seoul (KR); Sang Su Kim, Suwon (KR); Ki Chul Kim, Suwon (KR); Jin-Hee Kim, Seong-Nam (KR); In-Wook Cho, Yong-In (KR); Sung-Ho Kim, O-San (KR); Kwang-Wook Koh, Seong-Nam (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/953,553

(22) Filed: Sep. 30, 2004

(65) Prior Publication Data

US 2005/0048702 A1 Mar. 3, 2005

Related U.S. Application Data

(62) Division of application No. 10/388,631, filed on Mar. 17, 2003, now Pat. No. 6,815,764.

(51) Int. Cl.
*H01L 21/8247* (2006.01)

(52) U.S. Cl. ............................ 438/261; 438/954
(58) Field of Classification Search ......... 438/257–267, 438/954
See application file for complete search history.

(56) References Cited

U.S. PATENT DOCUMENTS

| 5,067,108 | A | 11/1991 | Jenq |
| 5,467,308 | A | 11/1995 | Change et al. |
| 6,011,725 | A | 1/2000 | Eitan |
| 6,388,293 | B1 | 5/2002 | Ogura et al. |
| 6,399,441 | B1 | 6/2002 | Ogura et al. |
| 6,281,545 | B1 | 8/2002 | Liang et al. |
| 6,642,573 | B1 | 11/2003 | Halliyal et al. |
| 6,750,103 | B1 | 6/2004 | Higashitani et al. |
| 2003/0160280 | A1 | 8/2003 | Yoshino |
| 2004/0000689 | A1 | 1/2004 | Lai et al. |
| 2004/0191989 | A1 * | 9/2004 | Ngo et al. .................. 438/257 |

FOREIGN PATENT DOCUMENTS

WO 0034984 6/2000

OTHER PUBLICATIONS

"Dry Etching for ULSI Fabrication"; pp. 686–688.

(Continued)

*Primary Examiner*—Richard A. Booth
(74) *Attorney, Agent, or Firm*—Harness, Dickey & Pierce

(57) ABSTRACT

A local SONOS structure having a two-piece gate and a self-aligned ONO structure includes: a substrate; an ONO structure on the substrate; a first gate layer on and aligned with the ONO structure; a gate insulator on the substrate aside the ONO structure; and a second gate layer on the first gate layer and on the gate insulator. The first and second gate layers are electrically connected together. Together, the ONO structure and first and second gate layers define at least a 1-bit local SONOS structure. A corresponding method of manufacture includes: providing a substrate; forming an ONO structure on the substrate; forming a first gate layer on and aligned with the ONO structure; forming a gate insulator on the substrate aside the ONO structure; forming a second gate layer on the first gate layer and on the gate insulator; and electrically connecting the first and second gate layers.

13 Claims, 13 Drawing Sheets

OTHER PUBLICATIONS

Johnson et al. "Selective Chemical Etching of Polycrystalline Sige Alloys with Respect to Si and $SiO_2$"; Department of Electrical and Computer Engineering; © 1992; pp. 805–810.

Skotnicki et al.; "Well–Controlled, Selectively Under–Etched Si/SiGe Gates for RF and High Performance CMOS"; St. Microelectronics; © 2000 IEEE; pp. 156–157.

Pidin et al.; "A Notched Metal Gate MOSFET for SUB–0.1 µm Operation"; Fujitsu Laboratories Ltd.; (2) 2000 IEEE; pp. 659–661.

Korean Office Action dated Jul. 12, 2005, with English Translation.

* cited by examiner $L_2 > L_1 > L_3$

LOCAL SONOS-TYPE STRUCTURE HAVING TWO-PIECE GATE AND SELF-ALIGNED ONO AND METHOD FOR MANUFACTURING THE SAME

This application is a divisional of U.S. patent application Ser. No. 10/388,631, filed Mar. 17, 2003, now U.S. Pat. No. 6,815,764 the contents of which is incorporated herein in its entirety by reference.

DESCRIPTION OF THE BACKGROUND ART

In general, semiconductor memory devices for storing data are divided into volatile memory devices, which are likely to lose their data when the power supply is interrupted, and nonvolatile memory devices, which can retain their data even when the power supply is interrupted. Compared to other nonvolatile memory technologies, e.g., disk drives, nonvolatile semiconductor memories are relatively small. Accordingly, nonvolatile memory devices have been widely employed in mobile telecommunications systems, memory cards, etc.

Recently, nonvolatile memory devices having silicon-oxide-nitride-oxide-silicon (SONOS) structures, e.g., SONOS-type nonvolatile memory devices, have been proposed. The SONOS-type nonvolatile memory devices have thin cells which are simple to manufacture and can be easily incorporated, e.g., into a peripheral region and/or a logic region of an integrated circuit.

A SONOS-type nonvolatile semiconductor memory device according to the Background Art will be described with reference to FIG. 1. The SONOS-type nonvolatile semiconductor memory device 10 includes: a silicon substrate 6 having doped source and drain regions 5; a tunnel oxide layer 1; a nitride layer 2 on the tunnel oxide layer 1; a top oxide layer 3 on the nitride layer 2; and a polycrystalline silicon (polysilicon) gate layer 4 on the oxide layer 3. Together the layers 1, 2 and 3 define an oxide-nitride-oxide (ONO) structure 1/2/3.

In operation, electrons or holes are injected into the tunnel oxide layer 1 from the inversion region induced between the source 5 and drain 5. The nitride layer 2 is a charge trapping layer that traps electrons or holes that penetrate through the tunnel oxide layer 1. The top oxide layer 3 is provided to prevent any electrons or holes that escape the trapping layer 2 from reaching the polycrystalline silicon layer 4 during write or erase operations. The structure 10 can be described as a stacked SONOS-type cell.

When the gate electrode 4 is positively charged, electrons from the semiconductor substrate 6 become trapped in a region 7 of the nitride layer 2. Conversely, when the gate electrode 4 is negatively charged, holes from the semiconductor substrate 6 become trapped in the region 7. The depiction of the region 7 in FIG. 1 is asymmetric with respect to a vertical center line (not depicted) of the SONOS-type semiconductor memory device 10. FIG. 1 assumes a situation in which the drain corresponds to the region 5 at the right side of FIG. 1 while the source corresponds to the region 5 at the left side of FIG. 1, with the drain also assumed to be biased at a higher voltage than the source. Accordingly, electrons/holes accumulate near the higher-biased drain.

The electrons or the holes trapped in the region 7 can change the threshold voltage of the entire nonvolatile semiconductor memory device. When the gate threshold voltage reaches a predetermined level, i.e., when the current of a channel is reduced to a sufficiently low level, the programming process stops. The threshold voltage Vth is set to a value at which a bit '0' can be distinguished consistently from a bit '1' for data that has been retained a predetermined amount of time (rephrasing, Vth is set to a value at which a predetermined amount of data retention time can be achieved consistently).

Since an ONO structure (1/2/3) exists above the entire channel region, the stacked SONOS-type cell 10 has a high initial threshold voltage Vth (and corresponding high power consumption) and a high program current. Because of the high threshold voltage Vth and the high program current, it is difficult to embed the stack SONOS in system-on-a-chip (SoC) products which demand low power consumption.

In addition, in the stacked SONOS-type cell 10, electrons trapped in the nitride layer 10 can move laterally along the nitride layer, and thus an erase operation may not be completely performed. If programming operations and erase operations are repetitively performed, the threshold voltage Vth of on-cell (erased cell) can increase, which can reduce the on-cell current and read speed.

To address such problems, SONOS-type devices having various structures have been developed in the Background Art, e.g., the local SONOS-type cell 20 shown in FIG. 2. The SONOS-type cell 20 includes: a silicon substrate 26 having doped source and drain regions 25; a tunnel oxide layer 21 on the substrate 26; nitride layer segments 28 and 29 on the tunnel oxide layer 2 1; a dielectric layer 27 on the tunnel oxide layer 21; a top oxide layer 23 on the nitride layer segment 28, the dielectric layer 27 and the nitride layer segment 29; and a polycrystalline silicon gate layer 4 on the top oxide layer 23.

In contrast to FIG. 1, where the tunnel oxide layer 1 entirely covers the channel region between the source and drain regions 5, the nitride layer (not depicted, but from which the nitride layer segments 8 and 9 were formed) has had a center section removed, resulting in the nitride layer segments 8 and 9. By separating the nitride layer segments 8 and 9 (and filling the resulting gap with the dielectric layer 27), trapped electrons that would otherwise be able to migrate laterally along the nitride layer 2 of FIG. 1 are prevented from moving from the nitride layer segment 8 to the nitride layer segment 9 and vice versa. This improves the on-cell current and read speed. The separated ONO structures 21/(28 or 29)/23 are the reason for describing the SONOS-type cell 20 as a local SONOS-type cell. However, because a thick dielectric structure (layers 21, 27 and 23) exists above the entire channel region, the local SONOS-type cell 20 still has a high initial threshold voltage Vth.

FIG. 3 is a diagram showing another local SONOS-type cell 30 according to Background Art. The local SONOS-type cell 30 includes: a silicon substrate 26 having doped source and drain regions 25; an oxide layer 32 on the substrate 26, the oxide layer 32 having branches 34 and 38; nitride layer segments 36 formed between pairs of oxide layer branches 34 and 38, respectively; and a polycrystalline silicon gate layer 40. Each nitride layer segment 36 sandwiched between oxide branches 34 and 38 defines an ONO structure 34/36/38. The portion of the oxide layer 32 between the ONO structures is significantly thinner than the corresponding dielectric structure 21/27/23 in the local SONOS-type cell 20 of FIG. 2, which can improve (namely, lower) the threshold voltage Vth.

The operating characteristics of the local SONOS-type cell 30 can vary considerably depending on the length (L) of the overlap between the ONO structure 34/36/38 and the gate layer 40, where L is substantially the same as the length of the nitride layer segment 36. Accordingly, it is important to minimize variation in the length of the overlap between the ONO structures 34/36/38 and the gate 40.

Photolithography is used to define the length of the ONO structures 34/36/38 in FIG. 3. During the photography portion of the photolithography process, misalignment can occur, resulting in significant overlap variation.

To help depict the misalignment problem, FIGS. 4A and 4B are provided. FIG. 4A is a cross-section (of an intermediate structure produced at one stage in the manufacture of the SONOS-type cell 30 in FIG. 3) showing substantial alignment. FIG. 4B is a similar cross-section showing significant misalignment. To help convey the relationship between FIG. 3 and FIGS. 4A and 4B, regarding the arrangement of layers in FIG. 3 underneath the bracket 42, a corresponding arrangement of layers in FIG. 4 is located underneath bracket 442.

The intermediate structure 400 in FIG. 4A includes: a silicon semiconductor substrate 402; an ONO structure 404 on the substrate 402; a polycrystalline silicon layer 406 on the ONO structure 404 and on the substrate 402; and a photo resist (PR) 407 on the polycrystalline silicon gate layer 406. A gap 408 is depicted in the photo resist layer 407. The gap 408 is aligned so that when the underlying cross-hatched 410 is removed, the resulting overlap between the remaining ONO structures 404 and the gate layer 406 is substantially equal, as indicated by each overlap having the length L1.

FIG. 4B, in contrast, is a cross-section of an intermediate structure 420 according to the Background Art that corresponds to the intermediate structure 400, albeit suffering significant misalignment. The intermediate structure 420 includes: a silicon substrate 422; an ONO structure 424 on the substrate 422; a polycrystalline layer 426 on the ONO structure 424 and the substrate 422; and a photo resist layer 427 having in it gaps 428. When the cross-hatched areas 430 underneath the gaps 428 are removed via etching, the resulting ONO structures 424 will not be of the same width, as indicated by the lengths L2 and L3, where L2<L1<L3. As an example, where L1=150 nm, significant misalignment can produce lengths of about L2=100 nm and L3=200 nm. Such variation in the overlap lengths causes variation in the threshold voltages to be exhibited by the local SONOS-type cells, e.g., depending upon whether the cell has overlap L2 or L3.

A type of overlapped, but electrically separate, gate electrode architecture is known, e.g., U.S. Pat. No. 6,388,293 to Ogura et al. (the "Ogura patent"). Background Art FIG. 5 of the present application corresponds to FIG. 11 of the Ogura patent except for using 500-series numbering rather than 100-series numbering. The overlapped but electrically separate structure 500 of Background Art FIG. 5 includes: a semiconductor substrate 510 having doped source/drain regions 521 and 522; a three-strata gate insulator 532 formed on the substrate 510; a lower gate electrode 542 formed on the gate insulator 532; another gate insulator 531 formed on the substrate 510, the side edge of the other gate insulator 532, and the side edge and a portion of the top of the lower gate electrode 542; and an upper gate electrode 541 formed on the gate insulator 531. The three-strata gate insulator 532 can be an ONO structure, namely layer 532A being an oxide, layer 532B being a nitride and layer 532C being an oxide; other combinations of materials for the three strata are disclosed as well the Ogura patent. The three-strata gate insulator 532 is self aligned with the lower gate electrode 542. The lower gate electrode 542 and the upper gate electrode 541 are electrically separated, i.e., they are not electrically connected together. Moreover, the Ogura patent teaches that the electrical potential supplied to the lower gate electrode 542 should be large while the electrical potential supplied to the upper gate electrode 541 should be as small as the gate threshold voltage.

SUMMARY OF THE INVENTION

An embodiment of the invention provides a local SONOS structure comprising: a substrate; an ONO structure on the substrate; a first gate layer on and aligned with the ONO structure; a gate insulator on the substrate aside the ONO structure; and a second gate layer on the first gate layer and on the gate insulator, the first and second gate layers being electrically connected together, the ONO structure, the first gate layer and the second gate layer defining at least a 1-bit local SONOS structure.

Another embodiment of the invention provides a method of forming a local SONOS structure, the method comprising: providing a substrate; forming an ONO structure on the substrate; forming a first gate layer on and aligned with the ONO structure; forming a gate insulator on the substrate aside the ONO structure; forming a second gate layer on the first gate layer and on the gate insulator; and electrically connecting the first and second gate layers, the ONO structure, the first gate layer and the second gate layer defining at least a 1-bit local SONOS structure.

Additional features and advantages of the invention will be more fully apparent from the following detailed description of example embodiments, the appended claims and the accompanying drawings.

DETAILED DESCRIPTION OF EXAMPLE EMBODIMENTS

An embodiment of the invention is the recognition that variation in the overlap length, L (between a gate electrode and an ONO-type structure), can be negated as a problem if the gate electrode is formed as a two-piece structure, where the ONO-type structure is self-aligned with the first piece of the gate electrode. In other words, this embodiment is a recognition that alignment tolerance of the upper or second piece of the two-part gate electrode substantially does not induce variation in the threshold voltage Vth if the ONO-type structure is self-aligned with the lower or first electrode of the two-piece gate electrode.

Figure 1:
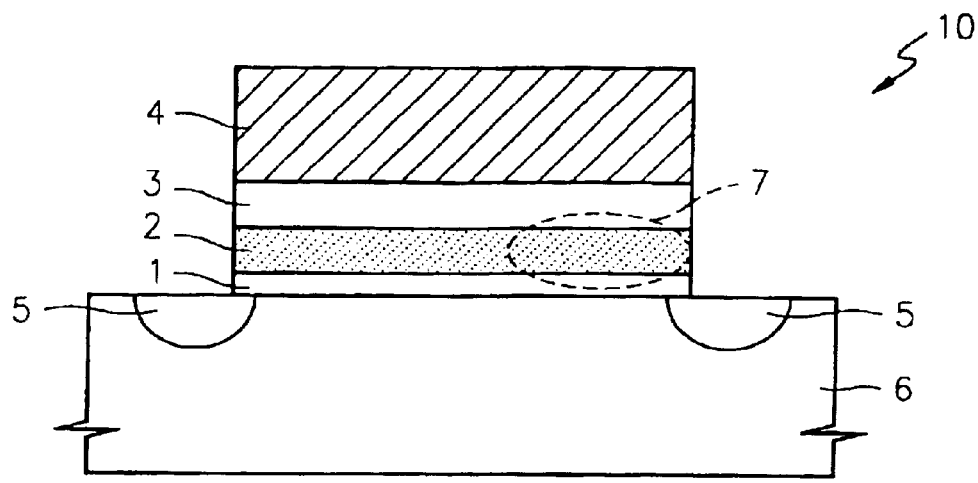
FIG. 1 is a cross-section of a SONOS-type nonvolatile memory according to the Background Art.
Figure 2:
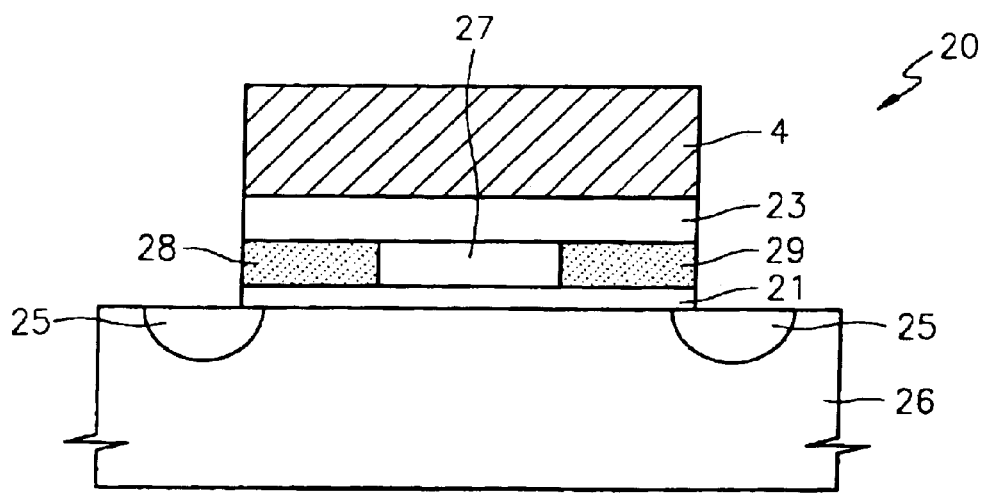
FIG. 2 is a cross-section of another local SONOS-type nonvolatile memory according to the Background Art.
Figure 3:
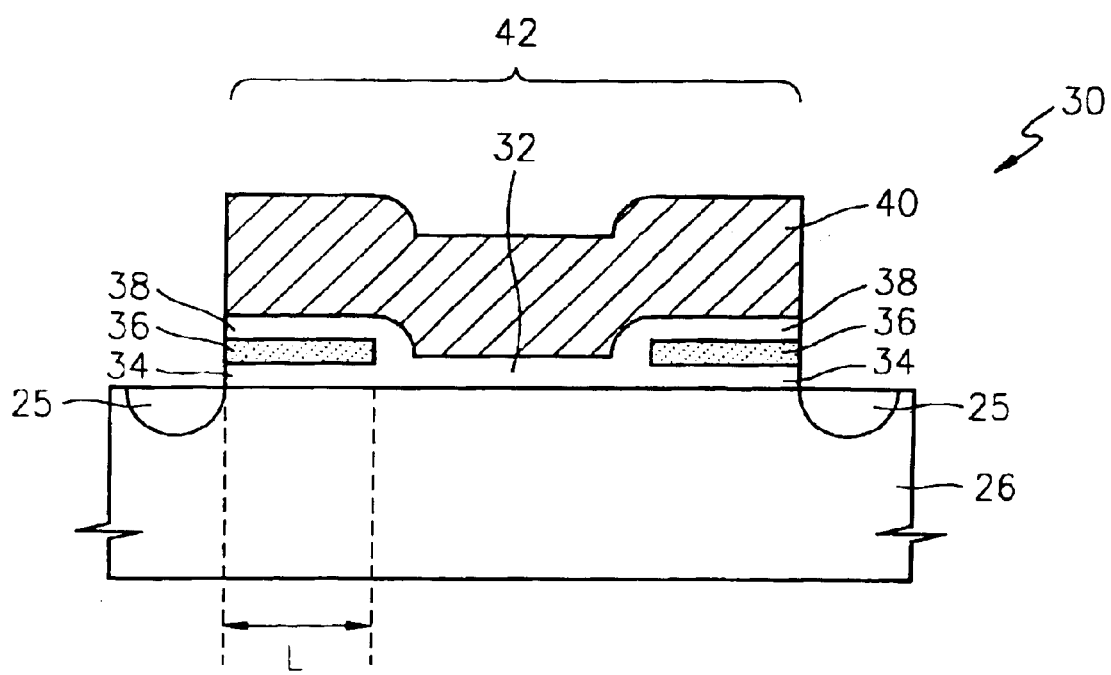
FIG. 3 is a cross-section of yet another local SONOS-type nonvolatile memory according to the Background Art.
Figure 4A:
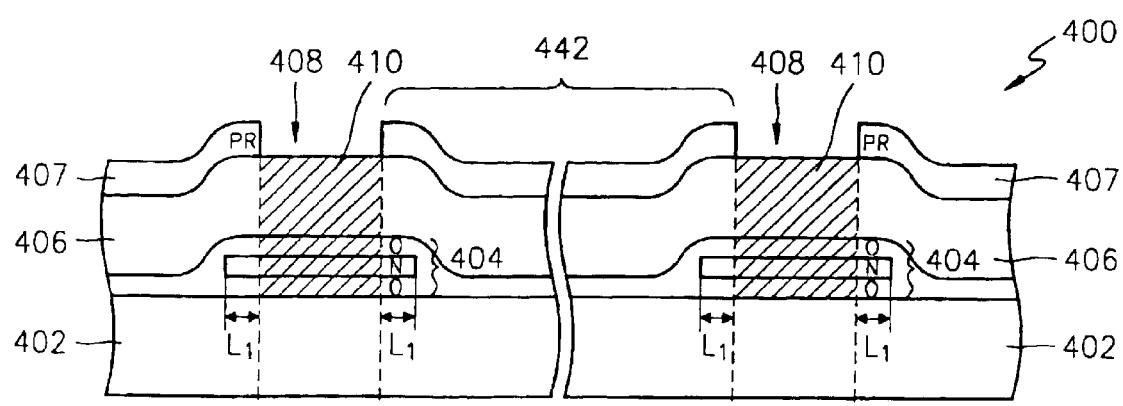
FIGS. 4A and 4B are cross-sections of intermediate structures according to the Background Art formed during the fabrication of the local SONOS-type structure of FIG. 3.
Figure 4B:
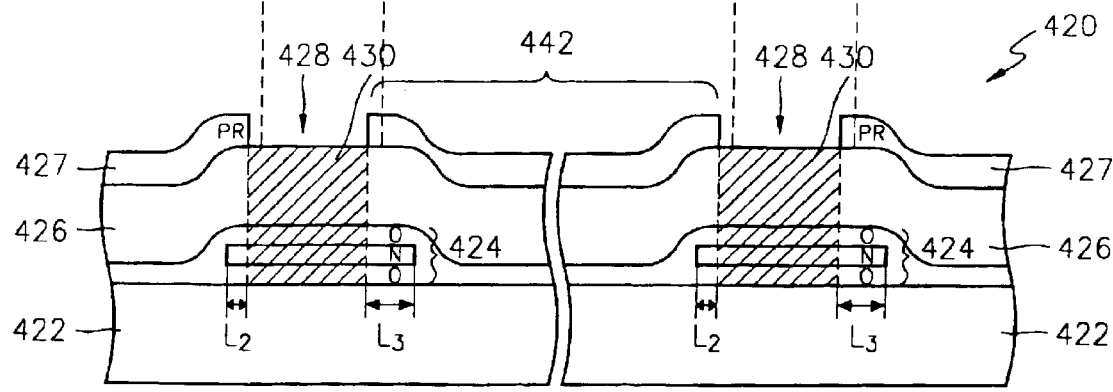
Figure 5:
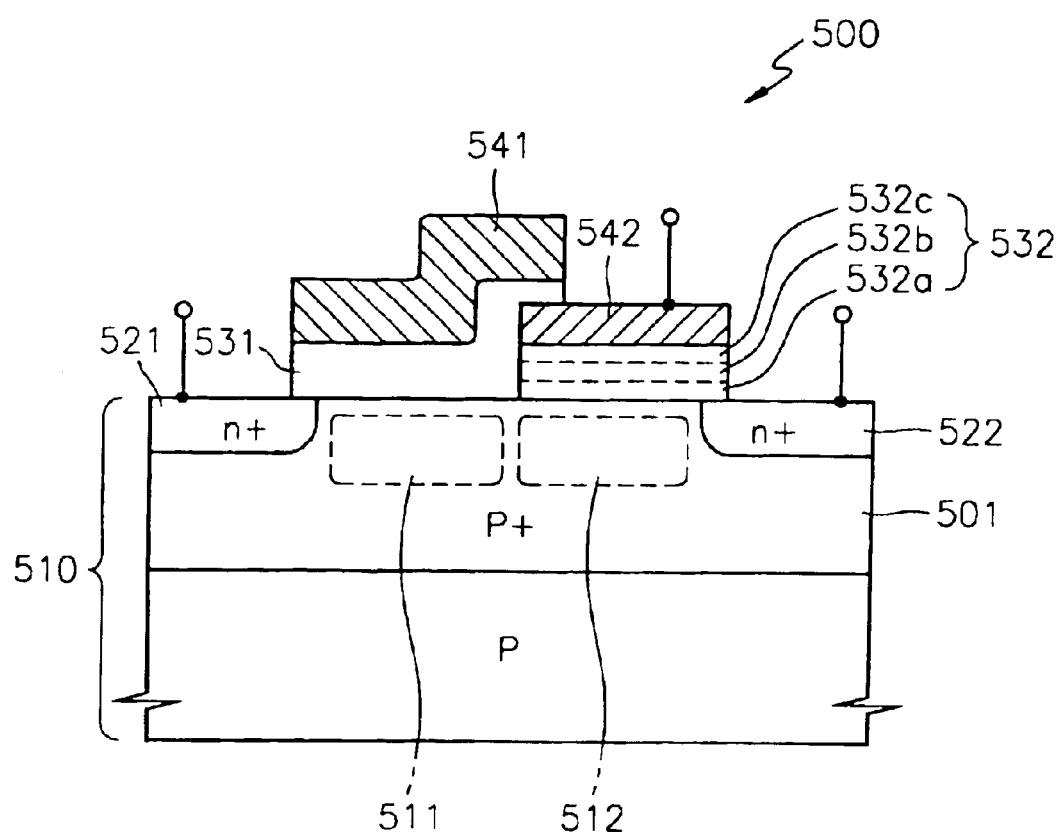
FIG. 5 is a cross-section of a SONOS-type structure according to the Background Art having overlap but electrically separated gate electrodes.
Figure 6:
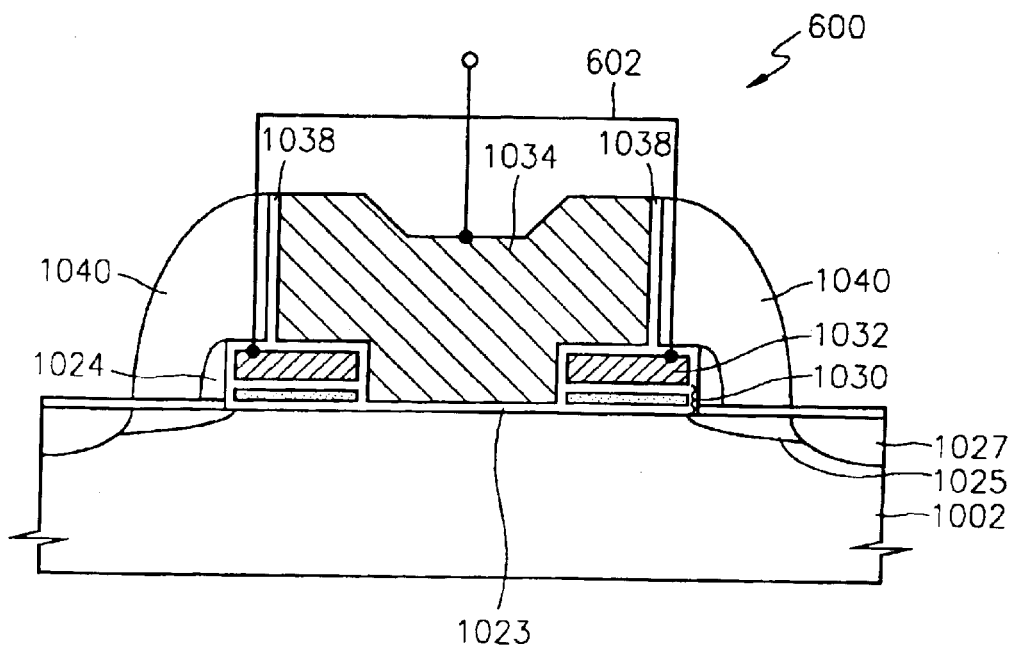
FIG. 6 is a cross-section of a local SONOS-type structure having a two-piece gate configuration according to an embodiment of the invention.

FIG. 6 is a cross-section of a local SONOS-type structure 600 having a two-piece gate configuration according to an embodiment of the invention. The structure 600 can be used, e.g., in nonvolatile semiconductor memory devices such as are found in mobile telecommunication systems, memory cards, compact processor-based electronics, etc.

The structure 600 includes: a semiconductor, e.g., silicon, substrate 1002 having drain/source (LDD) regions 1025/1027, the region 1025 being the lightly doped region and the region 1027 being the highly doped region; oxide/nitride/oxide (ONO) structures 1030 on the substrate 1002; lower gate electrodes 1032 on the ONO structures 1030; a gate insulator layer 1023 on the substrate 1002, the side edges of the ONO structures 1030, and the side edges and top surface of the lower gate electrodes 1032; dielectric layer segments 1024 formed at the other side edge of ONO structure 1030 and the other side edge of the lower gate elecrode 1032; an upper gate electrode 1034 on the gate insulator 1023; substantially vertical dielectric layer segments 1038 aside the upper gate electrode 1034; and sidewall spacers 1040 located in direct contact with the dielectric layer segments 1038 and on the gate insulating layer 1023 and the dielectric layer 1024. The lower gate electrodes 1032 are electrically connected to the upper gate electrode 1034, as indicated by the circuit symbolism having reference number 602.

The lower gate electrodes 1032 can be, e.g., polycrystalline silicon. The ONO structures 1030 can include the following combinations of strata: O/N/O; ON/N/O; ON/N/ON; O/N/ON; O/T/O; ON/T/O; ON/T/ON; and O/T/ON; where O denotes silicon oxide, N denotes silicon nitride oxide film, N denotes silicon nitride film and T denotes tantalum oxide film. The upper gate electrodes 1034 can be, e.g., polycrystalline silicon.

Figure 7:
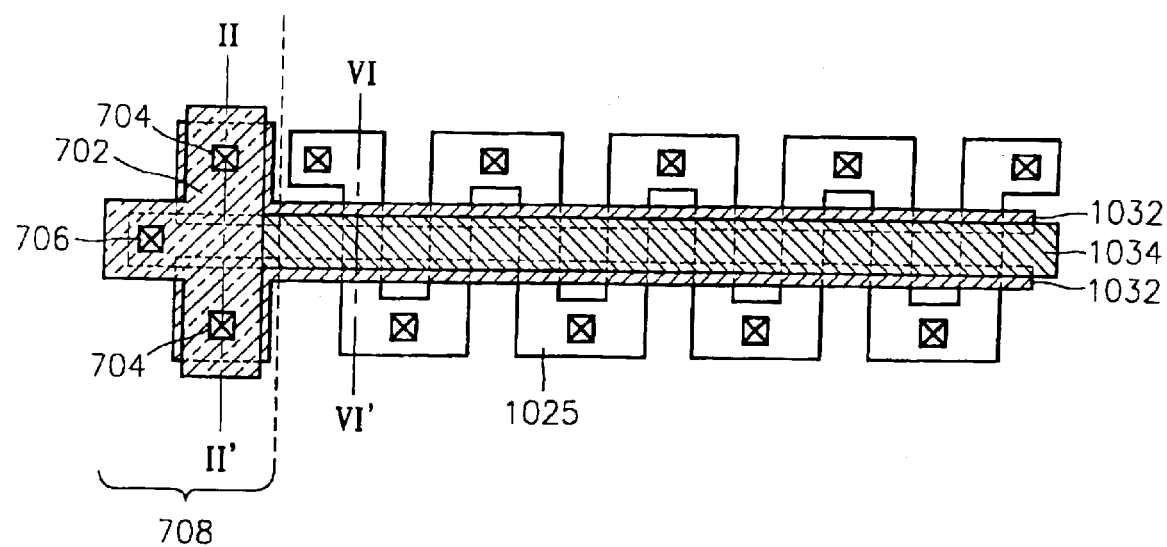
FIG. 7 is a top view showing interconnections between a plurality of the local SONOS-type structures of FIG. 6.

FIG. 7 is a top view corresponding to FIG. 6 that shows a plurality of the local SONOS-type structures 600. A vertical phantom line VI–VI' has been shown to help explain the correspondence between FIGS. 6 and 7. It is to be noted that FIG. 7 includes an end region 708 where the lower gate electrodes 1032 and the upper gate electrode 1034 are electrically connected together.

In the region 708, a conductive layer 702, e.g., aluminum or titanium, is shown overlying the lower gate electrodes 1032 and the upper gate electrode 1034. The conductive layer 702 can, but does not necessarily have to be, formed directly in contact with the layers 1032 and 1034. In FIG. 7, conductive plugs 704 are depicted as electrically connecting the conductive layer 702 and the lower gate electrodes 1032. Also, a conductive plug 706 is shown as electrically connecting the conductive layer 702 with the upper gate electrode layers 1034. Thus, the electrical path between the upper gate electrode layer 1034 and the lower gate electrodes 1032 goes through the conductive plug 706 to the conductive layer 702, and from the conductive layer 702 through the conductive plug 704 to each of the lower gate electrodes 1032.

Figure 8:
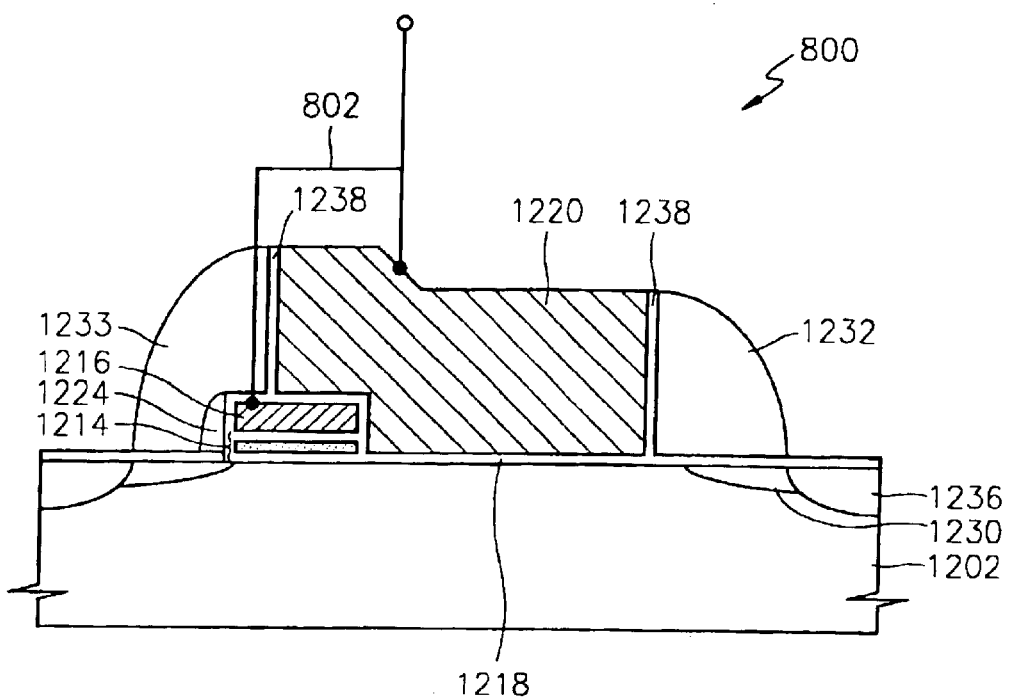
FIG. 8 is a cross-section of another LOCOS-type structure having a two-piece gate configuration according to another embodiment of the invention.

FIG. 8 is a cross-section of another SONOS-type structure 800 having a two-piece gate configuration according to another embodiment of the invention. Like the structure 600, the structure 800 is well suited to, e.g., nonvolatile (NV) semiconductor memory devices (not shown) for use in such things as mobile telecommunication systems, memory cards, etc. The system 800 includes: a semiconductor e.g., silicon, substrate 1202 having source/drain regions 1230/1236 of which the sub region 1230 is lightly doped and the sub region 1236 is heavily doped; and ONO structures 1214 (similar to the ONO structures 1030) formed on the substrate 1202; a lower gate electrode 1216 formed on the ONO structure 1214; a gate insulator layer 1218 formed on the substrate, the side edges of the ONO structure 1214, and on the side edges and top surface of the lower gate electrode 1214; an upper gate electrode 1220; substantially vertical dielectric layer segments 1238 aside the upper gate electrode 1220; a side spacer 1224 on the gate insulating layer 1218; and sidewall spacers 1232 and 1233 against the dielectric layer segments 1238, respectively. The lower gate electrode 1216 and the upper gate electrode 1220 are electrically connected together, as indicated by the circuit symbolism having reference number 802. The materials for the components in FIG. 8 can be, e.g., the same as for the corresponding components in FIG. 6.

Figure 9:
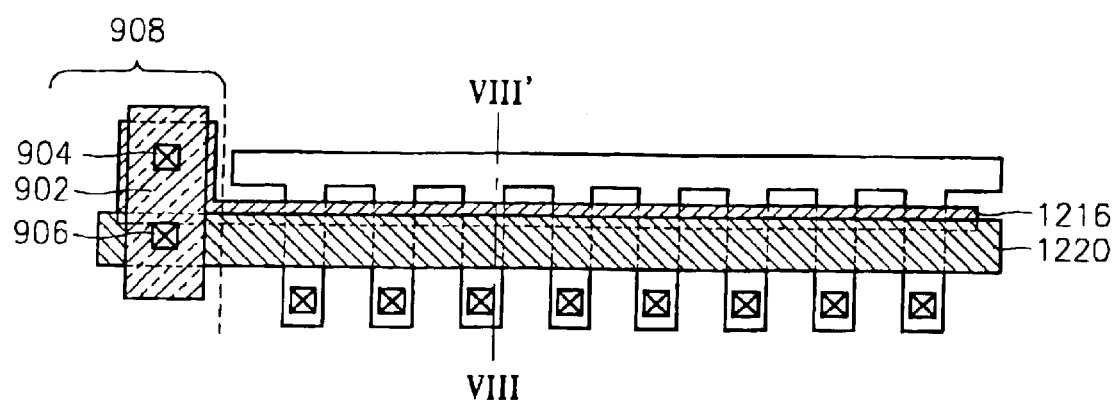
FIG. 9 is a top view showing interconnections between a plurality of the local SONOS-type structures of FIG. 8.

FIG. 9 is a top view corresponding to FIG. 8 that shows a plurality of SONOS-type structures 800. A vertical phantom line labeled VIII–VIII' has been shown in FIG. 9 to help explain the correspondence between FIGS. 8 and 9. FIG. 9 depicts an end region 908 that is similar to the end region 708 of FIG. 7. Region 908 includes: a conductive layer 902 (corresponding to 702); a conductive plug 904 (corresponding to 704); and a conductive plug 906 (corresponding to 706).

FIGS. 10A–10E are cross-sections of intermediate products formed at various points during a method of manufacturing (a local SONOS-type structure 600) according to an embodiment of the invention.

Figure 10A:
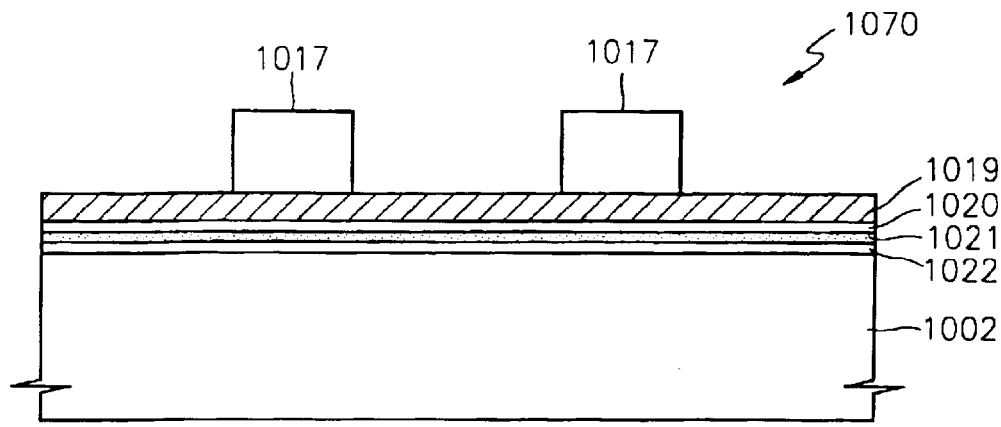
FIGS. 10A–10E are cross-sections of intermediate products formed at various points during a method of manufacturing (a local SONOS-type structure such as in FIG. 6) according to an embodiment of the invention.

In FIG. 10A, a substrate layer 1002 is provided. An oxide layer 1022 is formed on the substrate layer 1002. A nitride layer 1021 is formed on the oxide layer 1022. An oxide layer 1020 is formed on the nitride layer 1021. A layer 1019 of electrode material is formed on the oxide layer 1020. And patterned photo resist segments 1017 are formed on the electrode material layer 1020, resulting in an intermediate structure 1070.

The oxide layer 1022 can have a thickness in the range of about 15 Å–about 100 Å. The thickness of the nitride layer 1021 can be in the range of about 20 Å–about 100 Å. The thickness of the oxide layer 1020 can be in the range of about 30 Å–200 Å. The thickness of the electrode material layer 1019 can be in the range of about 100 Å–800 Å. The electrode material layer 1019 can be doped polycrystalline silicon upon which an ion implantation process is performed. Alternatively, the electrode material layer 1019 can be tungsten or tungsten silicide (WSix) upon which an ion implantation process is performed, or the layer 1019 can be a metal compound.

Figure 10B:
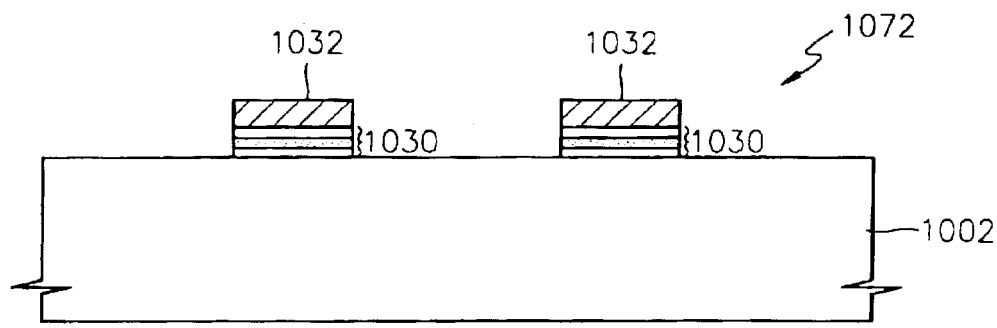
Figure 10C:
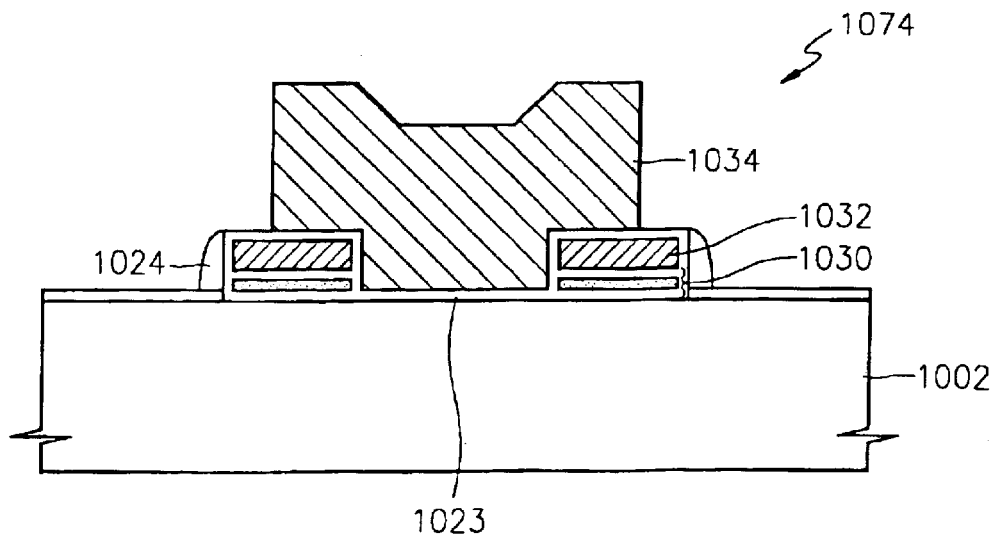

The intermediate structure 1070 is etched resulting in the intermediate structure 1072 of FIG. 10B. The intermediate structure 1072: includes the ONO structures 1030 and the lower gate electrodes 1032. The ONO structures 1030 include segments remaining from each of the layers 1022, 1021 and 1020.

An oxide layer (not shown) is formed on the intermediate structure 1072. Then a second layer (not depicted) of electrode material is formed on the oxide layer; both are subsequently, e.g., patterned and etched (not shown), to produce the upper gate electrode 1034 and the oxide layer 1023. The second gate electrode 1034 can alternatively be formed (not shown) by growing a polycrystalline layer using selective silicon epitaxial growth. The result, at this point, is the intermediate structure 1074 of FIG. 10C.

Figure 10D:
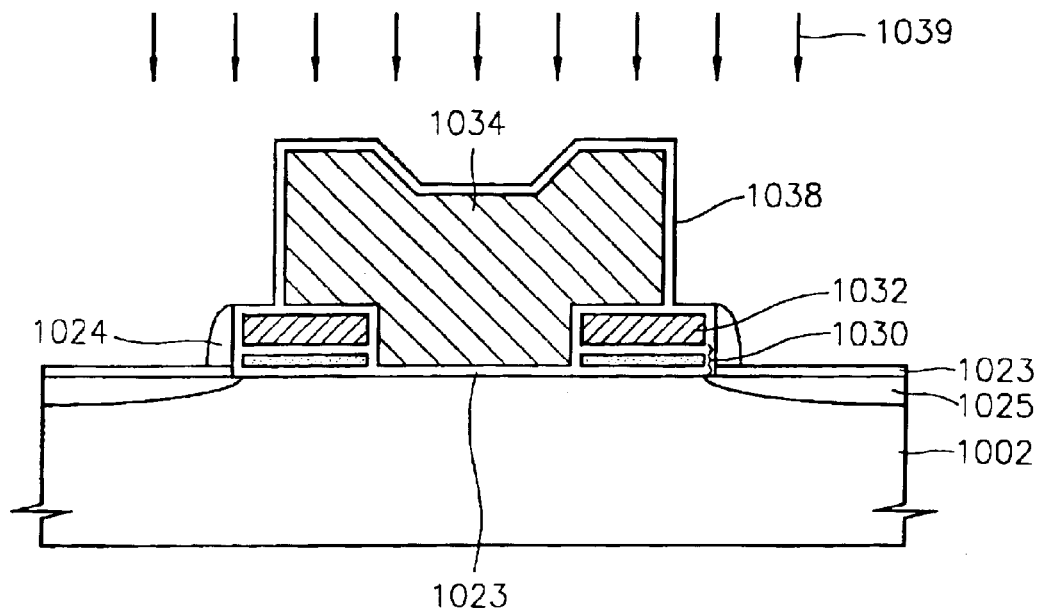

FIG. 10D shows an oxide layer 1038 that has been formed on the intermediate structure 1074. Then, an ion implantation process is performed as depicted by the downwardly-pointing arrows 1039. The result of the ion implantation process 1039 is the formation of lightly doped regions 1025 in the substrate 1002.

Figure 10E:
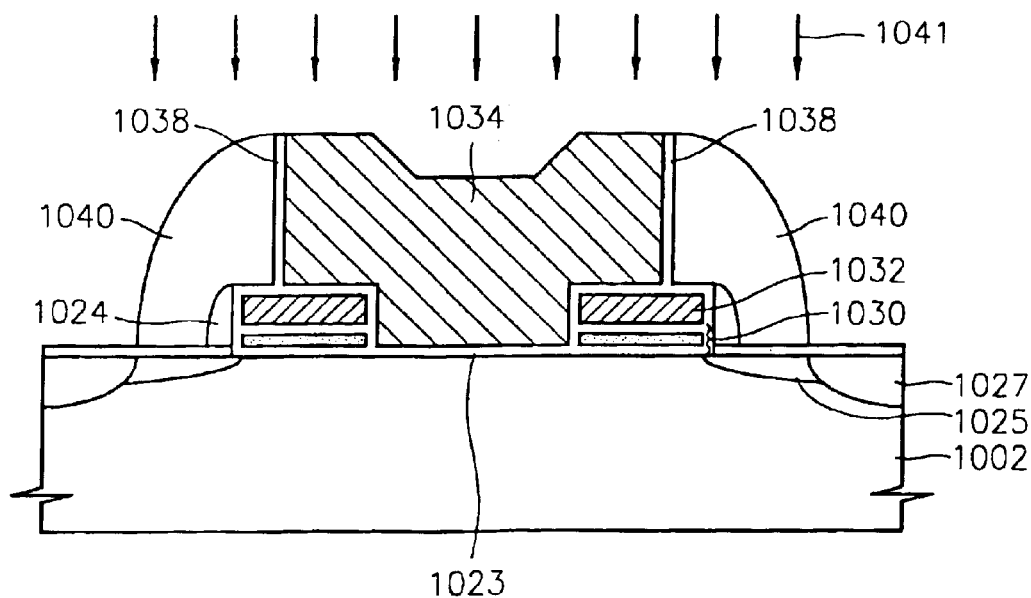

In FIG. 10E, subsequently, sidewall spacers 1040 have been formed. Then an ion implantation process (depicted by the downwardly-pointing arrow 1041) is performed, resulting in the heavily doped sub regions 1027, thereby completing the source/drain regions 1025/1027, the portion of the dielectric layer 1038 lying on the top surface of the gate electrode 1034 has been etched away in cleaning step.

Figure 11A:
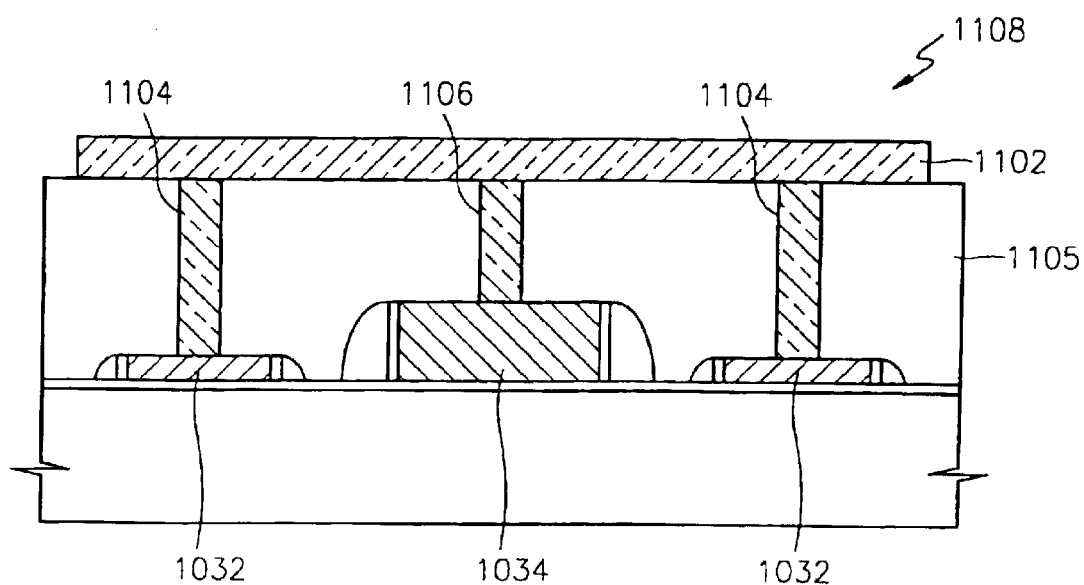
FIG. 11A is a cross-section of an end region corresponding to the end region in FIG. 7.

FIG. 11A is a cross-section of an end region 1108 corresponding to the end region 708 in FIG. 7. As such, there are the following correspondences: conductive plug 1106 corresponds to plug 706; conductive plugs 1104 correspond to plugs 704; and conductive layer 1102 corresponds to layer 702. The plugs 1104 and 1106 are formed into a planarizing dielectric layer 1105, e.g., at an intermediate point in a manufacturing process corresponding to the intermediate structure depicted in FIG. 10E.

Figure 11B:
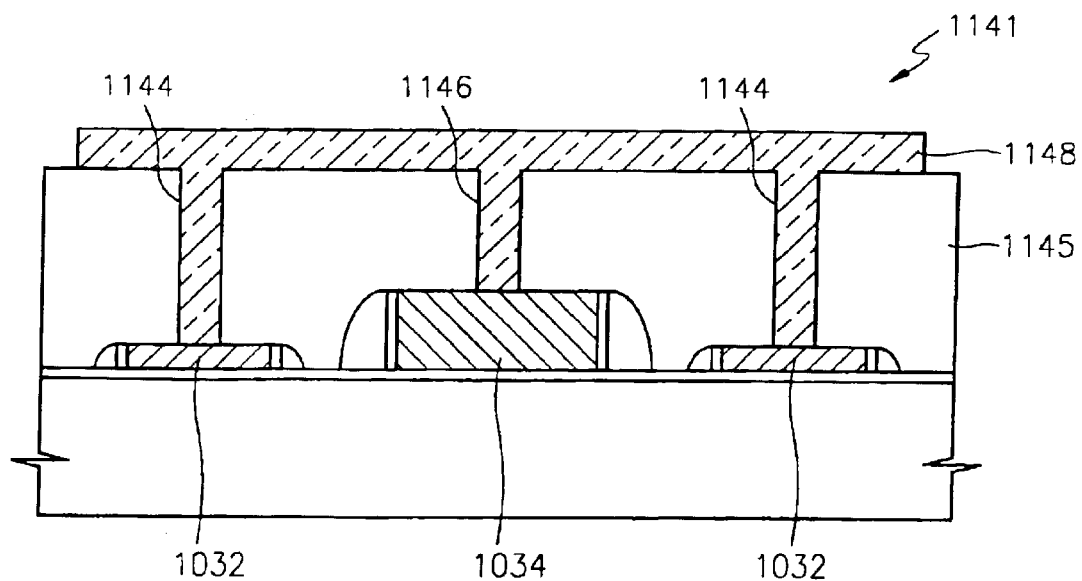
FIG. 11B is a cross-section of an end region alternative to the end region of FIG. 11A.

FIG. 11B is an alternative embodiment of the end region 1108. The end region 1141 of FIG. 11B has similarities to the end region 1108, which include: a dielectric layer 1145 corresponding to layer 1105; plug-like portions 1144 corresponding to plugs 1104; plug-like portion 1146 corresponding to plug 1106; and a layer-like portion 1148 corresponding to layer 1102. The end region 1141 is a damascene-type of implementation. Rather than lying on the dielectric 1145 (as does the conductive layer 1102 relative to the dielectric 1105), the layer-like portion 1148 is formed into a recess within the dielectric 1145. Similarly, contact holes for the plug-like portions 1144 and 1146 are formed in the dielectric 1145 but are filled by a continuous material having plug-like portions 1144 and 1146 that are continuous with the layer-like portion 1148.

FIGS. 12A–12E are cross-sections of intermediate products formed at various points during a method of manufacturing (a local SONOS-type structure 800) according to an embodiment of the invention.

Figure 12A:
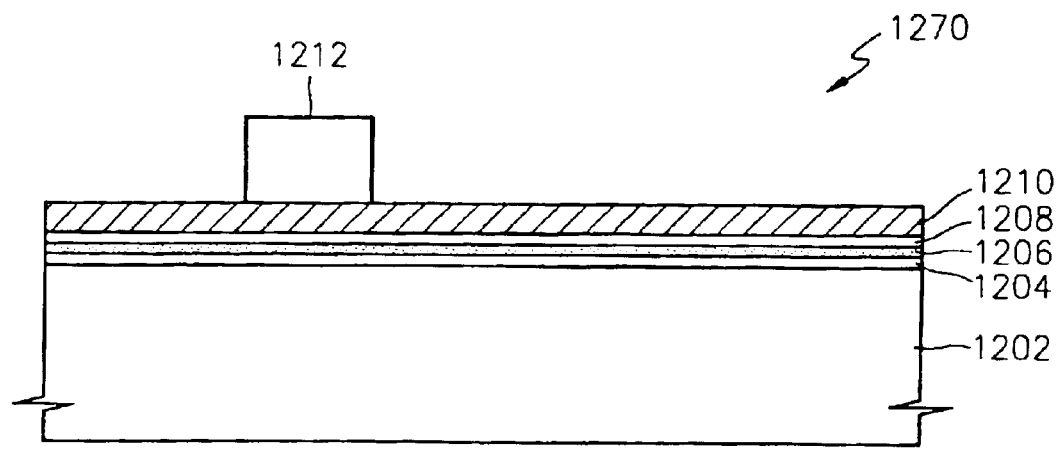
FIGS. 12A–12E are cross-sections of intermediate products formed at various points during a method of manufacturing (a local SONOS-type structure such as in FIG. 8) according to another embodiment of the invention.

In FIG. 12A, a substrate layer 1202 is provided. An oxide layer 1204 is formed on the substrate layer 1002. A nitride layer 1206 is formed on the oxide layer 1204. An oxide layer 1208 is formed on the nitride layer 1206. A layer 1210 of electrode material is formed on the oxide layer 1208. And a patterned photo resist segment 1212 is formed on the electrode material layer 1210, resulting in an intermediate structure 1270.

The oxide layer 1204 can have a thickness in the range of about 15 Å–about 100 Å. The thickness of the nitride layer 1206 can be in the range of about 20 Å–about 100 Å. The thickness of the oxide layer 1208 can be in the range of about 30 Å–200 Å. The thickness of the electrode material layer 1210 can be in the range of about 100 Å–800 Å. The electrode material layer 1210 can be doped polycrystalline silicon upon which an ion implantation process is performed. Alternatively, the electrode material layer 1210 can be tungsten or tungsten silicide (WSix) upon which an ion implantation process is performed, or the layer 1210 can be a metal compound.

Figure 12B:
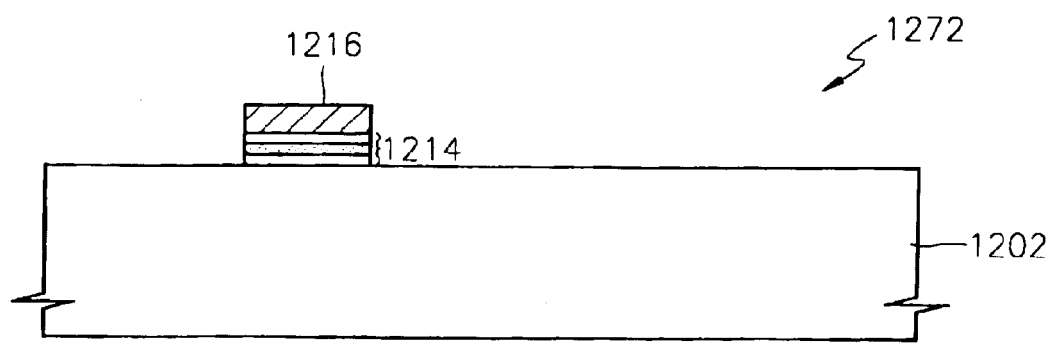
Figure 12C:
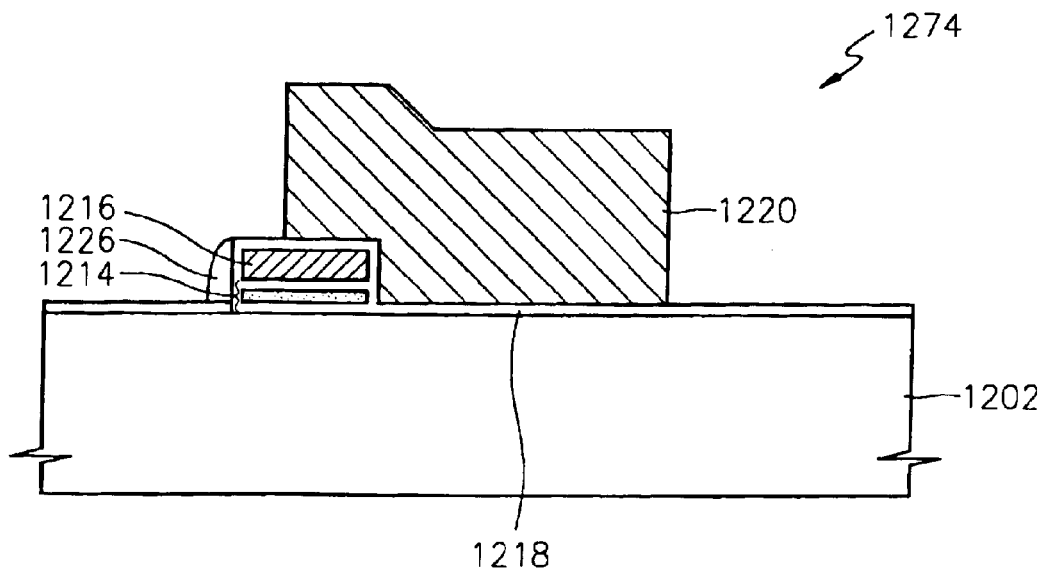

The intermediate structure 1270 is etched resulting in the intermediate structure 1272 of FIG. 12B. The intermediate structure 1272: includes the ONO structures 1214 and the lower gate electrode 1216. The ONO structure 1214 includes a segment remaining from each of the layers 1204, 1206 and 1208.

An oxide layer (not shown) is formed on the intermediate structure 1272. Then a second layer (not depicted) of electrode material is formed on the oxide layer; both are subsequently, e.g., patterned and etched (not shown), to produce the upper gate electrode 1220 and the oxide layer 1218. The second gate electrode 1220 can alternatively be formed (not shown) by growing a polycrystalline layer using selective silicon epitaxial growth. The result, at this point, is the intermediate structure 1274 of FIG. 12C.

Figure 12D:
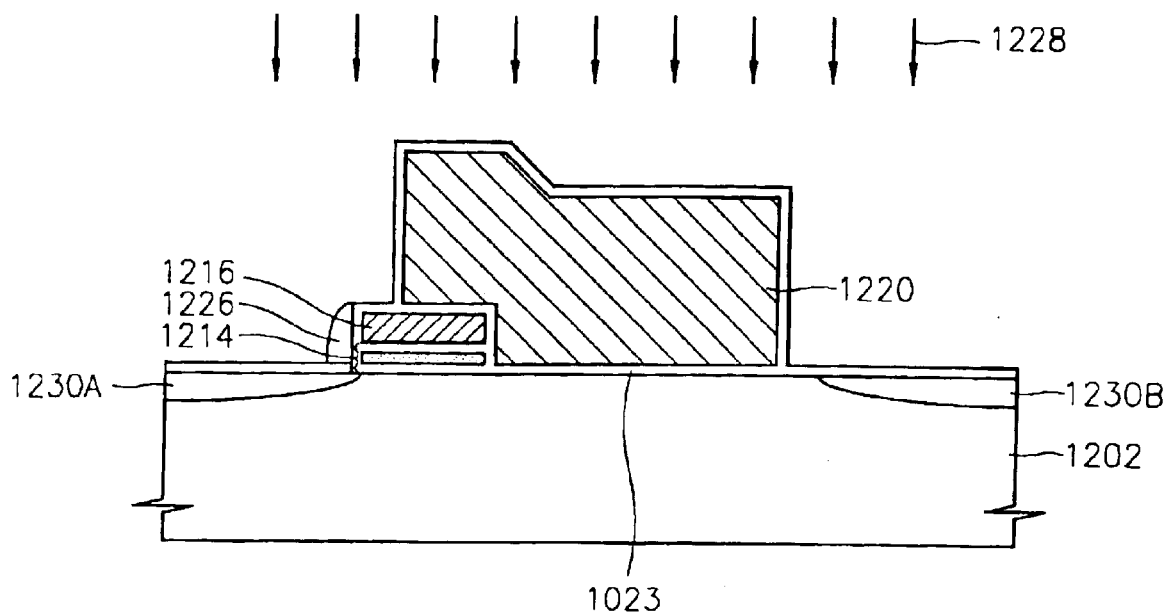

FIG. 12D shows an ion implantation process is performed, as depicted by the downwardly-pointing arrows 1228. The result of the ion implantation process 1228 is the formation of lightly doped regions 1230A and 1230B in the substrate 1202.

Figure 12E:
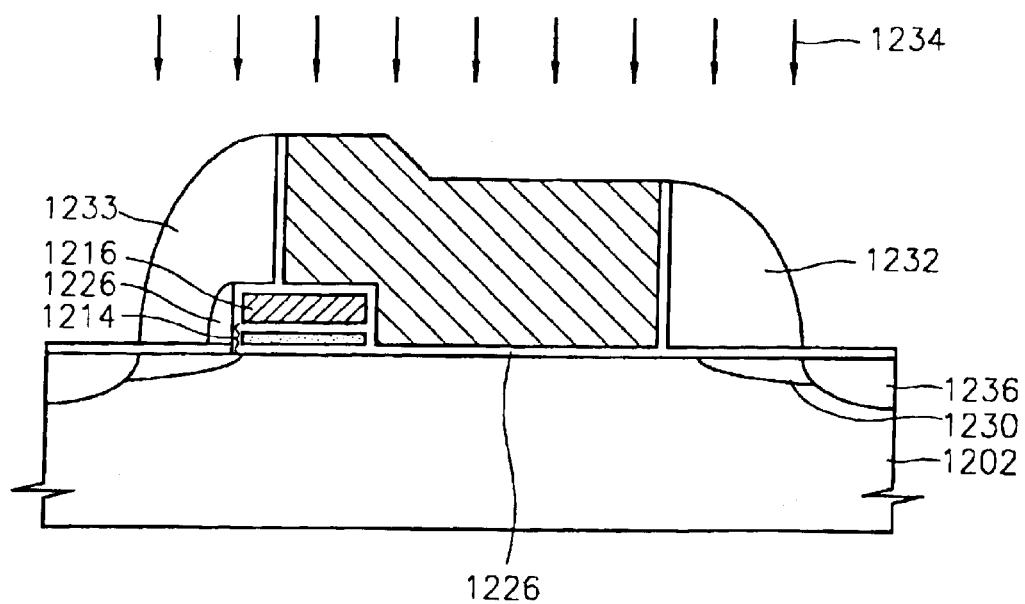

In FIG. 12E subsequently, sidewall spacers 1232 and 1233 are formed. Then an ion implantation process (depicted by the downwardly-pointing arrow 1234) is performed, resulting in the heavily doped sub regions 1236, thereby completing the LDD regions 1230A/1236 and 1230B/1236. The portion of the dielectric layer 1226 lying on the top surface of the gate electrode 1220 has been etched away in a cleaning step.

Figure 13:
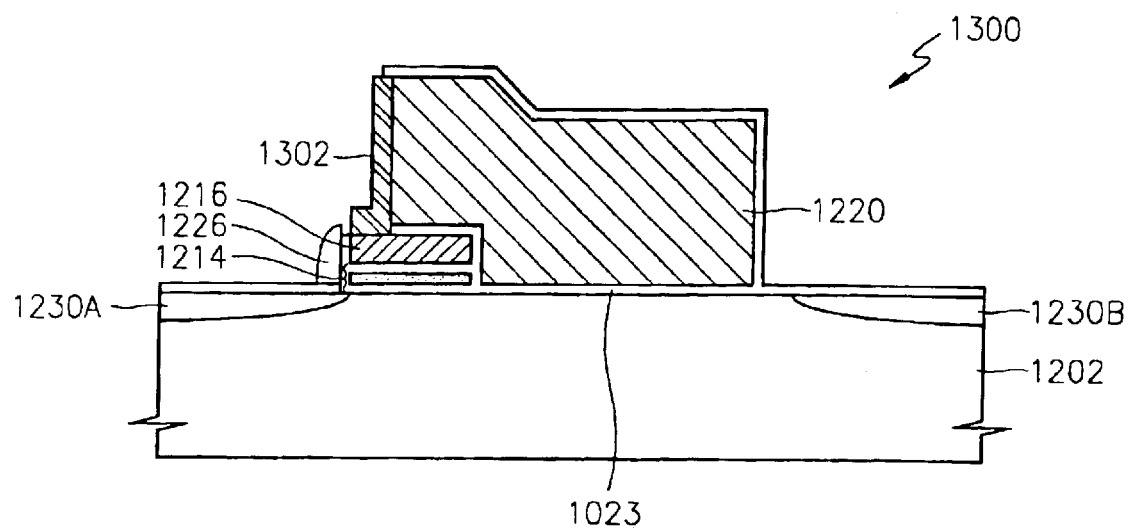
FIG. 13 is a cross-section of a local SONOS-type structure having an alternative configuration of the two-piece gate configuration relative to FIG. 8.

FIG. 13 is a cross-section of an alternative configuration 1300 relative to the structure 800. Similarities relative to the structure 800 will not be discussed, for brevity. In the configuration 1300, the lower gate electrode 1214 and the upper gate electrode 1220 are electrically connected together by an epitaxially grown polysilicon layer 1302, e.g., located in a region corresponding to the end region 908.

Figure 14:
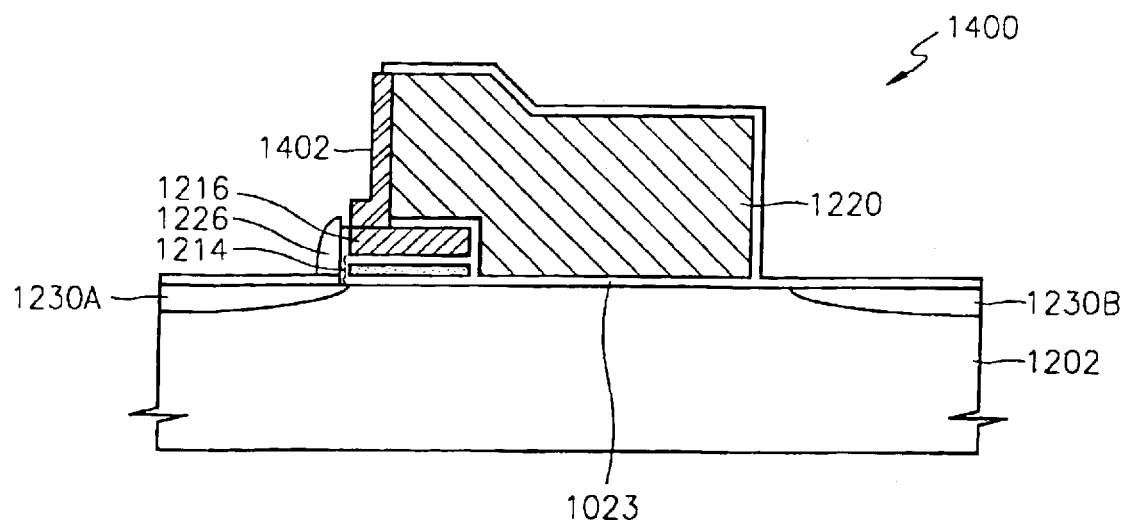
FIG. 14 is a cross-section of a local SONOS-type structure having another alternative configuration of the two-piece gate configuration relative to FIG. 8.

FIG. 14 is a cross-section of another alternative configuration 1400 that is similar to the configuration 1300. In the configuration 1400, a salicide layer 1402 has been formed in place of the epitaxially-grown layer 1302.

Figure 15:
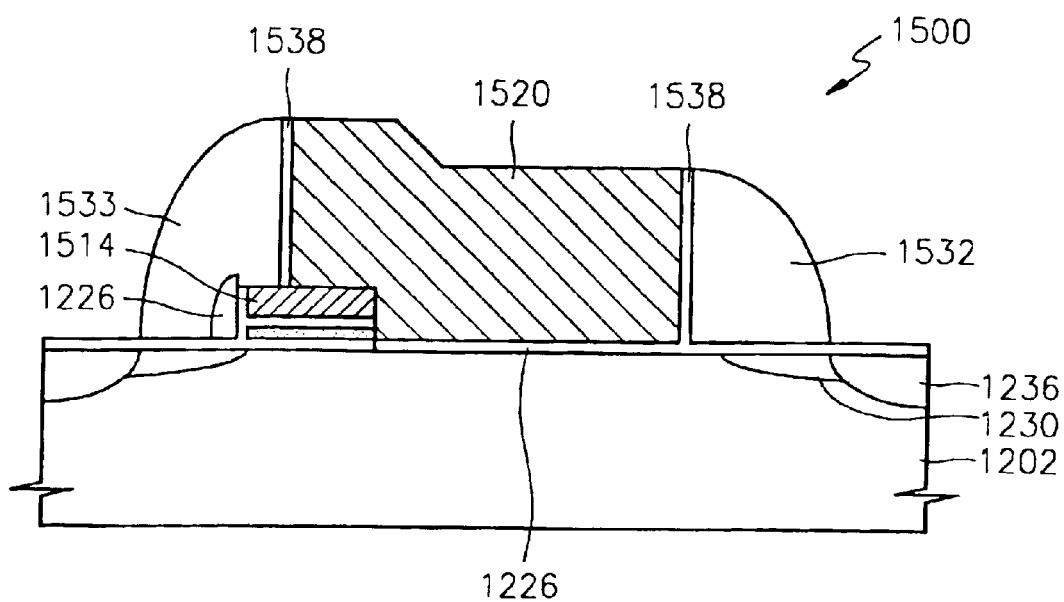
FIG. 15 is a cross-section of a local SONOS-type structure having yet another alternative configuration of the two-piece gate configuration relative to FIG. 8.

FIG. 15 is yet another alternative configuration 1500 relative to the configuration 1300. In the configuration 1500, the upper gate electrode 1520 has been formed directly in contact with the lower gate electrode 1514, thus creating an electrical connection. A substantially vertical segment of a dielectric layer 1538 (corresponding to 1238) has been provided. And similarly, a sidewall spacer 1533 (corresponding to 1233) has been provided. In contrast to the sidewall spacer 1233, a portion of the sidewall spacer 1533 is formed directly in contact with the top surface of the lower gate electrode 1514.

The present invention and exemplary embodiments thereof are described more fully with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. In the drawings, the thickness of layers and regions are exaggerated for clarity. When a layer is referred to as being "on" another layer or substrate, the layer may be directly on the other layer or substrate, or intervening layers may also be present.

What is claimed is:

1. A method of forming a local SONOS structure, the method comprising:

providing a substrate;

forming an ONO structure on the substrate;

forming a first gate layer on and aligned with the ONO structure;

forming a gate insulator on the substrate aside the ONO structure;

forming a second gate layer on the first gate layer and on the gate insulator; and electrically connecting the first and second gate layers, the ONO structure, the first gate layer and the second gate layer defining at least a 1-bit local SONOS structure.

2. The method of claim 1, wherein the forming of the gate insulator also results in the gate insulator being formed on the first gate layer such that the gate insulator is present between the first gate layer and the second gate layer.

3. The method of claim 1, wherein the forming of the second gate layer results in a portion of the fist gate layer remaining exposed; and the forming of the second gate layer results in the second gate layer being located directly in contact with the exposed portion of the first gate layer.

4. The method of claim 1, wherein the aspect of electrically connecting includes:

forming a conductive layer directly in contact with a portion of the first gate layer and a portion of the second gate layer.

5. The method of claim 4, wherein the portion of the second gate layer is a side portion, and the aspect of electrically connecting includes growing the conductive layer epitaxially.

6. The method of claim 4, wherein the portion of the second gate layer is a side portion, and the aspect of electrically connecting includes forming the conductive layer as a salicide.

7. The method of claim 1, wherein the forming of the ONO structure results in a divided ONO structure having a first portion and a second portion laterally disposed from the first portion; and the forming of the first gate layer results in a divided first gate layer having a first portion and a second portion laterally disposed from the first portion;

the forming of the first gate layer also results in the first portion of the ONO structure being self-aligned with the first portion of the first gate layer and the second portion of the ONO structure being self-aligned with the second portion of the first gate layer;

the forming of the second gate layer results in the second gate layer being formed on the first portion of the first gate layer and on the second portion of the first gate layer; and the aspect of electrically connecting results in the first portion of the first gate layer, the second portion of the first gate layer and the second gate layer being electrically connected together;

the first and second portions of the ONO structure, the first and second portions of the first gate layer, and the second gate layer defining a 2-bit local SONOS structure.

8. The method of claim 7, wherein aspect of electrically connecting includes:

forming a dielectric layer on the 2-bit local SONOS structure; and forming first, second and third contact plugs extending down through the dielectric to be in electrical contact with the first and second portions of the first gate layer and the second gate layer, respectively; and forming a conductive layer electrically connecting the first, second and third contact plugs together such that the first portion of the first gate layer, the second portion of the first gate layer and the second gate layer are electrically connected together.

9. The method of claim 7, wherein the forming of the first gate layer and the forming of the second gate layer result in the first and second portions of the first gate layer, and the second gate layer, extending into an outer region located outside the area corresponding to the 2-bit local SONOS structure, respectively; and the forming of the first, second and third contact plugs locates the first and second contact plugs in the outer region ; and the forming of the conducting layer locates the conductive layer in the outer region.

10. The method of claim 7, wherein the forming of the first and second portions of the first gate layer and the forming of the second gate layer result in the first and second portions of the first gate layer and the second gate layer extending into an outer region located outside the area corresponding to the 2-bit local SONOS structure; and the method further comprising:

forming a conductive layer located in the outer region directly in contact with the first and second portions of the first gate layer and the second gate layer, the conductive layer electrically connecting the first and second portions of the first gate layer and the first and second portions of the second gate layer.

11. The method of claim 1, further comprising:

forming a dielectric layer on the at least 1-bit local SONOS structure; and forming first and second contact plugs extending down through the dielectric to be in electrical contact with the first gate layer and the second gate layer, respectively; and forming a conductive layer electrically connecting the first and second contact plugs together such that the first gate layer and the second gate layer are electrically connected together.

12. The method of claim 11, wherein the forming of the first gate layer and the forming of the second gate layer result in the first gate layer and the second gate layer extending into an outer region located outside the area corresponding to the at least 1-bit local SONOS structure; and the forming of the first, second and third contact plugs locates the first and second contact plugs in the outer region; and the forming of the conducting layer locates the conductive layer in the outer region.

13. The method of claim 1, wherein the forming of the first gate layer and the forming of the second gate layer result in the first gate layer and the second gate layer extending into an outer region located outside the area corresponding to the at least 1-bit local SONOS structure; and the method further comprises:

forming a conductive layer in the outer region directly in contact with the first gate layer and the second gate layer, the conductive layer electrically connecting the first gate layer with the second gate layer.

* * * * *